(12) United States Patent
Minamino et al.

(10) Patent No.: US 8,078,127 B2
(45) Date of Patent: Dec. 13, 2011

(54) RECEPTION DEVICE, RECEPTION METHOD AND PROGRAM

(75) Inventors: Takanori Minamino, Kanagawa (JP); Yasuhiro Iida, Tokyo (JP); Ryo Hasegawa, Tokyo (JP)

(73) Assignee: Sony Corporation, Toyko (JP)

( * ) Notice: Subject to any disclaimer, the term of this patent is extended or adjusted under 35 U.S.C. 154(b) by 441 days.

(21) Appl. No.: 12/340,975

(22) Filed: Dec. 22, 2008

(65) Prior Publication Data

US 2009/0163164 A1 Jun. 25, 2009

(30) Foreign Application Priority Data

Dec. 25, 2007 (JP) ................. P2007-331980

(51) Int. Cl.
*H04B 7/00* (2006.01)
(52) U.S. Cl. ...................... 455/234.1; 455/60
(58) Field of Classification Search ............... 455/234.1, 455/60
See application file for complete search history.

(56) References Cited

U.S. PATENT DOCUMENTS

| | | | |
|---|---|---|---|
| 6,215,989 B1 * | 4/2001 | Otaka ...................... | 455/234.1 |
| 7,161,896 B1 * | 1/2007 | Hart et al. ................ | 455/60 |
| 7,773,499 B2 * | 8/2010 | Hart et al. ................ | 455/60 |

FOREIGN PATENT DOCUMENTS

| | | |
|---|---|---|
| JP | 1 216676 | 8/1989 |
| JP | 2000 174829 | 6/2000 |

* cited by examiner

*Primary Examiner* — Lam T Mai
(74) *Attorney, Agent, or Firm* — Frommer Lawrence & Haug LLP; William S. Frommer; Thomas F. Presson

(57) ABSTRACT

A reception device includes: an AGC circuit adapted to control the amplitude of a receive signal; a correction circuit adapted to correct the flutter component in the output signal of the AGC circuit; a synchronization circuit adapted to establish synchronization with the signal whose flutter component has been corrected by the correction circuit; and an equalization circuit adapted to perform an equalization process based on the signal with which synchronization has been established by the synchronization circuit and output the equalized signal, wherein the correction circuit includes a detection circuit, an IIR filter, a gain circuit, a flutter component correction circuit, and a gain control circuit.

6 Claims, 10 Drawing Sheets

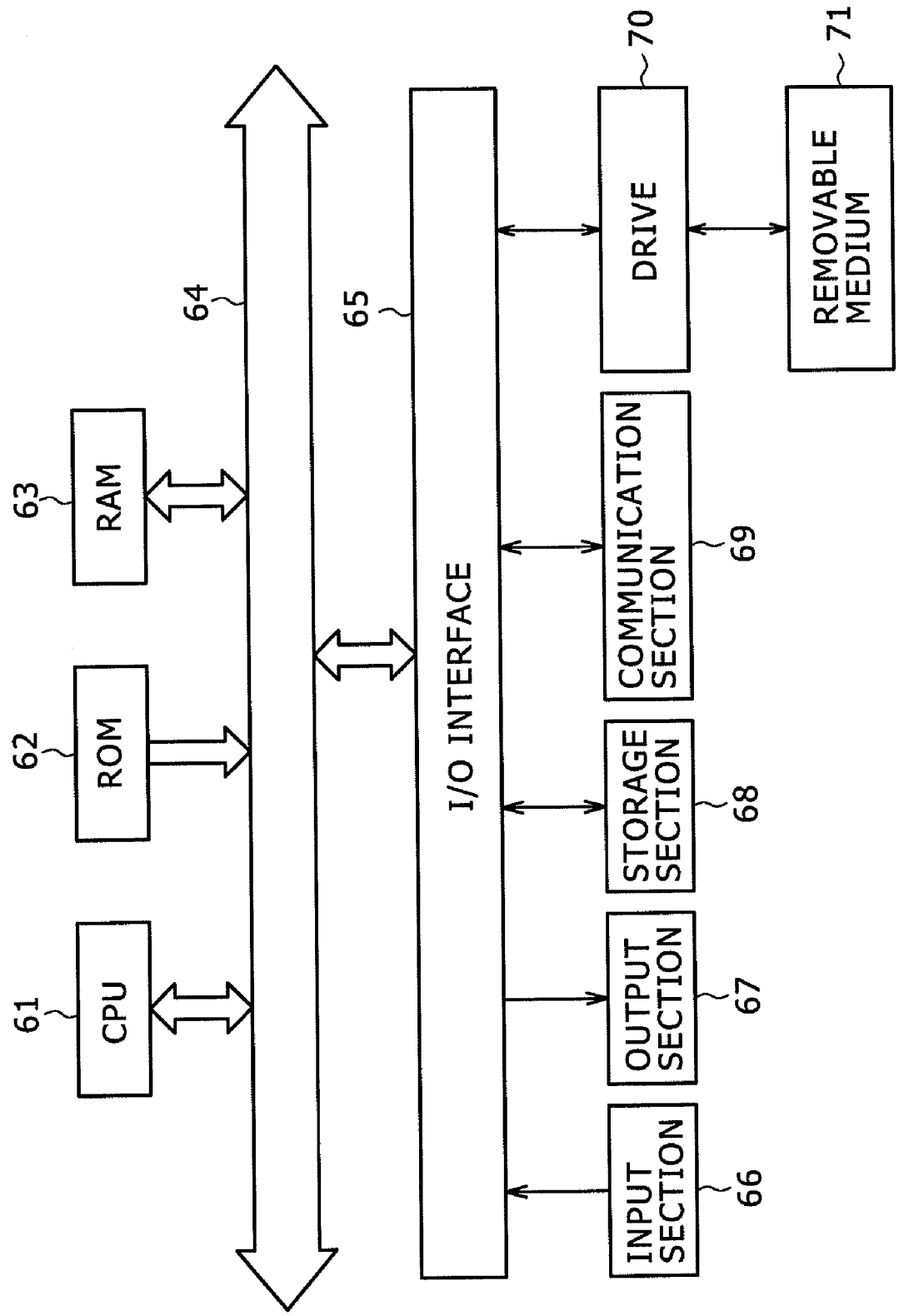

RECEPTION DEVICE, RECEPTION METHOD AND PROGRAM

CROSS REFERENCES TO RELATED APPLICATIONS

The present invention contains subject matter related to Japanese Patent Application JP 2007-331980 filed in the Japan Patent Office on Dec. 25, 2007, the entire contents of which being incorporated herein by reference.

BACKGROUND OF THE INVENTION

1. Field of the Invention

The present invention relates to a reception device, reception method and program, and more particularly to a reception device, reception method and program capable of quickly responding to the occurrence of a flutter.

2. Description of the Related Art

In the event of a flutter which is a significant change in amplitude at short intervals, the reception device must respond to such a change in amplitude by increasing the gain of its AGC (Automatic Gain Control) circuit.

FIG. 1 is a block diagram illustrating a configuration example of a demodulating section provided in an existing reception device.

An AGC circuit 1 adjusts the gain according to the signal from a synchronization circuit 2 to control the amplitude of the receive signal from an unshown antenna. For example, the AGC circuit 1 determines that a flutter has occurred if it does not receive any synchronizing signal from the synchronization circuit 2. As a result, the same circuit 1 increases the gain. The AGC circuit 1 outputs the amplitude-controlled signal to the synchronization circuit 2.

The synchronization circuit 2 performs a synchronization process adapted to establish synchronization with the signal supplied from the AGC circuit 1 and outputs the signal obtained from the synchronization process to the AGC circuit 1 and an equalization circuit 3.

The equalization circuit 3 performs an equalization process on the signal from the synchronization circuit 2 to provide the same phase and amplitude as when the signal was transmitted. Then, the same circuit 3 outputs the equalized signal obtained from the equalization process to the circuit at the subsequent stage.

As described above, existing reception devices perform a type of switching, i.e., increasing the gain of the AGC circuit 1, to handle a flutter if no synchronizing signal is available.

The gain may be increased if a flutter is detected by a flutter detection circuit provided separately rather than if no synchronizing signal is available.

[Patent Document 1] Japanese Patent Laid-Open No. 2000-174829

SUMMARY OF THE INVENTION

If a flutter is handled by the switching as described above, it takes more than usual time for the demodulating section to lock (establish synchronization) as a whole. The extra time is demanded to increase the gain of the channel having a flutter and redo the process.

Further, if a flutter begins to occur during the reception of a broadcast signal, the demodulating section unlocks, causing a retry of the process. This retry leads to an increased gain of the AGC circuit 1, almost certainly resulting in block noise although the demodulating section will be eventually able to demodulate the signal again.

The present invention has been made in light of the above problem, and it is desirable to provide a reception device, reception method and program capable of quickly responding to the occurrence of a flutter.

A reception device according to an embodiment of the present invention includes an AGC circuit, a correction circuit, synchronization circuit and an equalization circuit. The AGC circuit controls the amplitude of a receive signal. The correction circuit corrects the flutter component in the output signal of the AGC circuit 1. The synchronization circuit establishes synchronization with the signal whose flutter component has been corrected by the correction circuit. The equalization circuit performs an equalization process based on the signal with which synchronization has been established by the synchronization circuit and outputs the equalized signal. The correction circuit includes a detection circuit, IIR filter, gain circuit, flutter component correction circuit and gain control circuit. The detection circuit detects the difference between two signals, i.e., the signal obtained by correcting the flutter component in the output signal of the AGC circuit and the theoretical value signal whose flutter component has been corrected. The IIR filter filters the signal representing the difference detected by the detection circuit. The gain circuit controls the amplitude of the output signal of the IIR filter according to a predetermined gain. The flutter component correction circuit multiplies the output signal of the AGC circuit by a correction signal commensurate with the output signal of the gain circuit to correct the flutter component in the output signal of the AGC circuit. The gain control circuit controls the gain of the gain circuit based on the equalized signal from the equalization circuit or the signal obtained by correcting the flutter component in the output signal of the AGC circuit.

The gain control circuit can set the gain circuit to a gain commensurate with the intensity of the flutter component in the equalized signal from the equalization circuit.

The gain control circuit can find the intensity of the flutter component using the absolute value of the real number component, the absolute value of the real and imaginary number components, the power level of the real number component or the power level of the real and imaginary number components in the equalized signal.

Further, the gain control circuit can control the order of the IIR filter based on the equalized signal from the equalization circuit.

A reception method or program according to an embodiment of the present invention includes a step of detecting the difference between two signals, i.e., the signal obtained by correcting the flutter component in the output signal of the AGC circuit and the theoretical signal whose flutter component has been corrected. The reception method or program further includes a step of filtering the signal representing the detected difference. The reception method or program still further includes a step of controlling the amplitude of the filtered signal according to a predetermined gain. The reception method or program still further includes a step of multiplying the output signal of the AGC circuit by a correction signal commensurate with the signal obtained by controlling the amplitude according to the predetermined gain to correct the flutter component in the output signal of the AGC circuit. The reception method or program still further includes a step of controlling the predetermined gain based on the equalized signal or the signal obtained by correcting the flutter component in the output signal of the AGC circuit.

In an embodiment of the present invention, the difference is detected between two signals, i.e., the signal obtained by correcting the flutter component in the output signal of the AGC circuit and the theoretical value signal whose flutter component has been corrected. The signal representing the detected difference is filtered. The amplitude of the filtered signal is controlled according to a predetermined gain. The output signal of the AGC circuit is multiplied by a correction signal commensurate with the signal obtained by controlling the amplitude of the filtered signal according to the predetermined gain to correct the flutter component in the output signal of the AGC circuit. The predetermined gain is controlled based on the equalized signal or the signal obtained by correcting the flutter component in the output signal of the AGC circuit.

BRIEF DESCRIPTION OF THE DRAWINGS

FIG. 12 is a block diagram illustrating a configuration example of a computer.

DETAILED DESCRIPTION OF THE PREFERRED EMBODIMENT

An embodiment of the present invention allows for quick response to a flutter.

Figure 1:
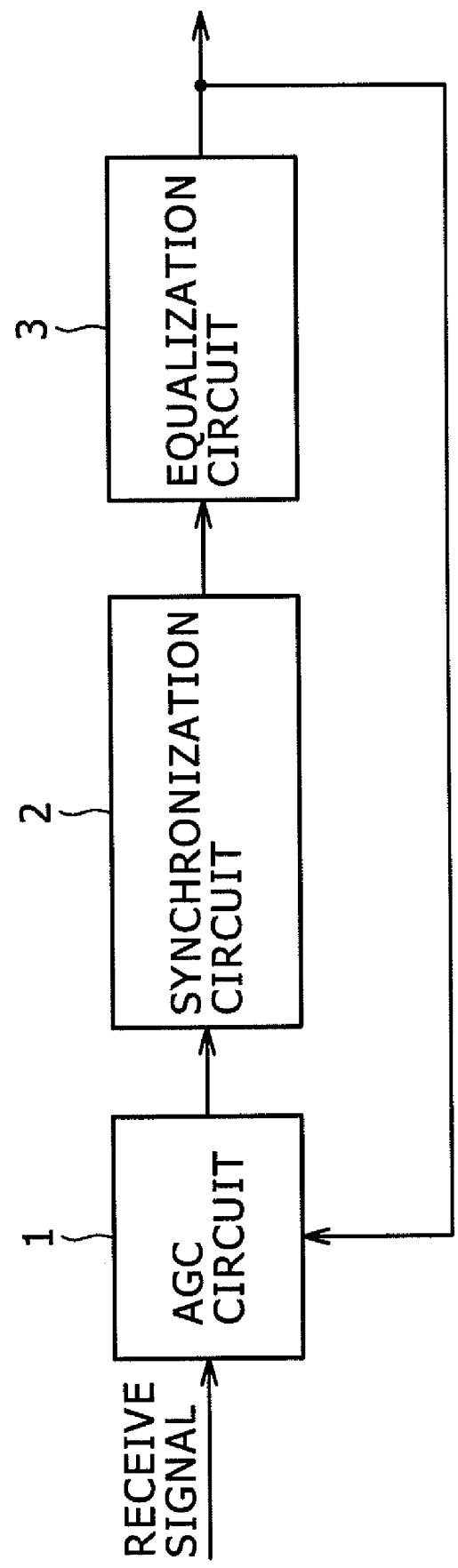
FIG. 1 is a block diagram illustrating a configuration example of a demodulating section provided in an existing reception device.
Figure 2:
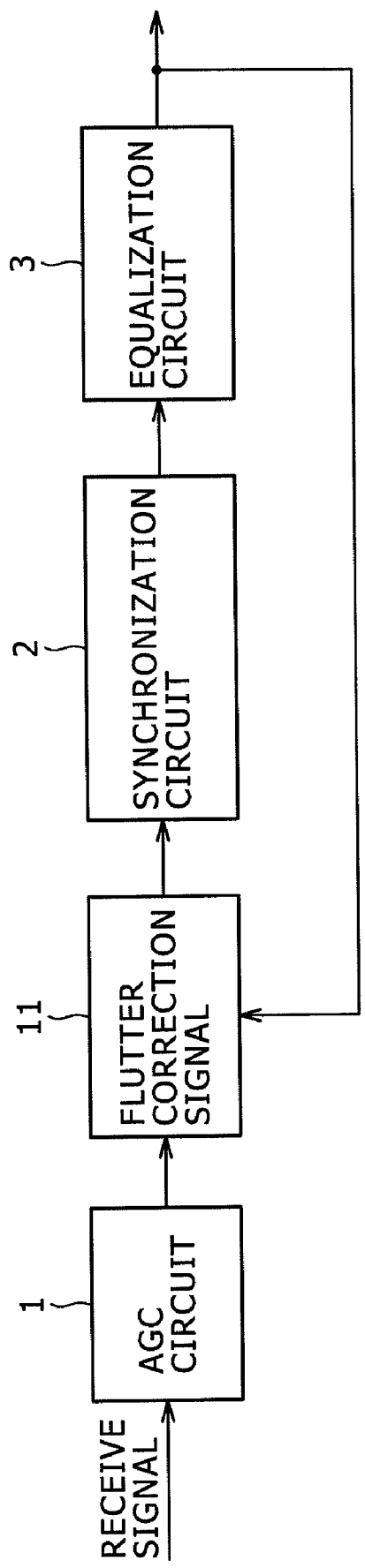
FIG. 2 is a block diagram illustrating a configuration example of a demodulating section provided in a reception device according to an embodiment of the present invention.

FIG. 2 is a block diagram illustrating a configuration example of a demodulating section provided in a reception device according to an embodiment of the present invention. In FIG. 2, like components as in FIG. 1 are denoted by like reference numerals.

As illustrated in FIG. 2, the demodulating section of the reception device includes a flutter correction circuit 11, in addition to an AGC circuit 1, a synchronization circuit 2 and equalization circuit 3. The flutter correction circuit 11 incorporates an AGC.

The AGC circuit 1 controls the amplitude of a receive signal supplied from an unshown antenna and modulated using VSB (Vestigial Sideband), QAM (Quadrature Amplitude Modulation) or other modulation scheme. The same circuit 1 outputs the amplitude-controlled signal to the flutter correction circuit 11.

The flutter correction circuit 11 detects the intensity of the flutter component based on the equalized signal from the equalization circuit 3 and adaptively changes the gain of the gain circuit incorporated therein according to the detected intensity, thus generating a correction signal for use in the correction of the flutter component. The same circuit 11 corrects the flutter component in the signal from the AGC circuit 1 using the generated correction signal to output the signal obtained from the correction of the flutter component to the synchronization circuit 2. The flutter correction circuit 11 will be described in detail later.

The synchronization circuit 2 performs a synchronization process to establish synchronization with the signal from the flutter correction circuit 11. The same circuit 2 outputs the signal obtained from the synchronization process to the equalization circuit 3.

The equalization circuit 3 performs an equalization process on the signal from the synchronization circuit 2 to provide the same phase and amplitude as when the signal was transmitted. The same circuit 3 outputs the equalized signal obtained from the equalization process to the circuit at the subsequent stage. The equalized signal is also supplied to the flutter correction circuit 11 from the equalization circuit 3.

Figure 3:
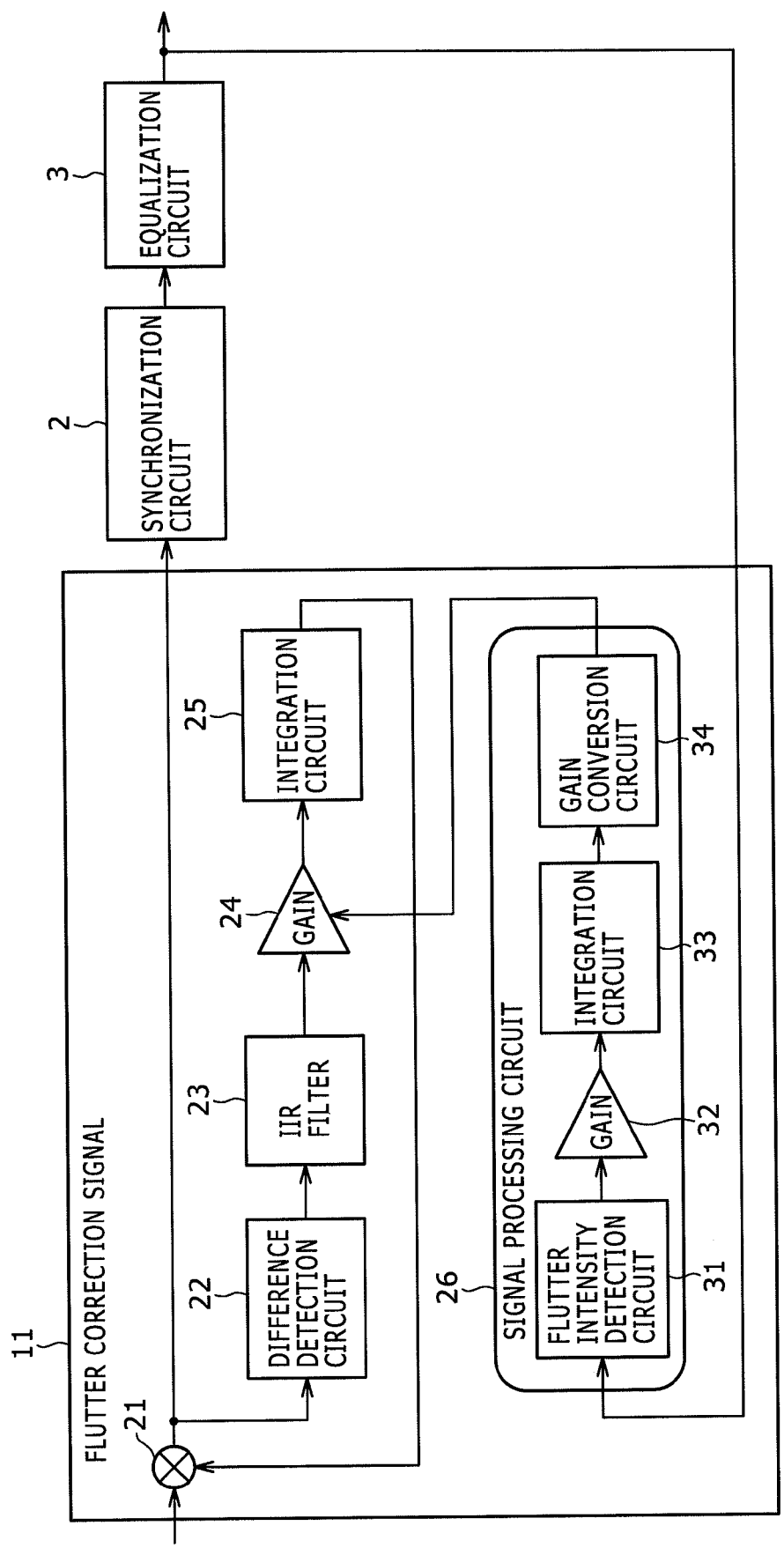
FIG. 3 is a block diagram illustrating a configuration example of the flutter correction circuit shown in FIG. 2.

FIG. 3 is a block diagram illustrating a configuration example of the flutter correction circuit 11 shown in FIG. 2.

As illustrated in FIG. 3, the flutter correction circuit 11 includes a multiplication circuit 21, difference detection circuit 22, IIR (Infinite Impulse Response) filter 23, gain circuit 24, integration circuit 25 and signal processing circuit 26. The signal processing circuit 26 includes a flutter intensity detection circuit 31, gain circuit 32, integration circuit 33 and gain conversion circuit 34. The signal from the AGC circuit 1 is fed to the multiplication circuit 21. The equalized signal from the equalization circuit 3 is fed to the flutter intensity detection circuit 31 of the signal processing circuit 26.

A loop adapted to feed the signal of the multiplication circuit 21 back to the same circuit 21 via the difference detection circuit 22, IIR filter 23, gain circuit 24 and integration circuit 25 serves as a main loop. Another loop adapted to feed the equalized signal from the equalization circuit 3 back to the gain circuit 24 via the respective circuits of the signal processing circuit 26 serves as a subloop.

The multiplication circuit 21 multiplies the signal from the AGC circuit 1 by a correction signal from the integration circuit 25 to correct (remove) the flutter component in the signal from the AGC circuit 1. The same circuit 21 outputs the signal obtained from the correction of the flutter component to the synchronization circuit 2. The signal from the multiplication circuit 21 is also supplied to the difference detection circuit 22.

The difference detection circuit 22 detects the difference between the signal from the multiplication circuit 21 and a target. For example, the theoretical value signal obtained after the correction of the flutter component is used as the target. The same circuit 22 detects the difference between the power level of the target signal and that of the actual signal obtained by the correction of the flutter component. The power level is expressed as $I^2+Q^2$, where I is the amplitude of an I signal, and Q the amplitude of a Q signal.

The difference detection circuit 22 outputs the signal representing the detected difference to the IIR filter 23.

The IIR filter 23 filters the signal from the difference detection circuit 22 and outputs the signal obtained from the filtering to the gain circuit 24.

The gain circuit 24 sets a gain according to the signal from the gain conversion circuit 34 of the signal processing circuit 26 to control the amplitude of the signal from the IIR filter 23.

For the input signal having a flutter component (signal supplied from the AGC circuit 1 to the multiplication circuit 21), the target behavior of the main loop is to spread the frequency band to be filtered by this loop, thus removing the flutter component using a correction signal. For the input signal having no flutter component, on the other hand, the target behavior of the main loop is to narrow down the frequency band to be filtered by this loop, thus outputting the input signal almost as-is.

The gain of the gain circuit 24 is set so that the above behavior is achieved. For example, if the intensity of the flutter component is high, a large gain is set. In contrast, if the intensity of the flutter component is low, a small gain is set.

The gain circuit 24 outputs the amplitude-controlled signal to the integration circuit 25.

The integration circuit 25 integrates the signal from the gain circuit 24 over a predetermined period and outputs the signal obtained from the integration to the multiplication circuit 21 as a correction signal.

The flutter intensity detection circuit 31 of the signal processing circuit 26 detects the difference between the equalized signal and the flutter component intensity detection target as the intensity of the flutter component in the equalized signal. The same circuit 31 uses, for example, the average of the absolute values of the amplitudes, taking into consideration the ideal signal point arrangement, as the flutter component intensity detection target. The same circuit 31 outputs the signal representing the detected intensity to the gain circuit 32.

Figure 4:
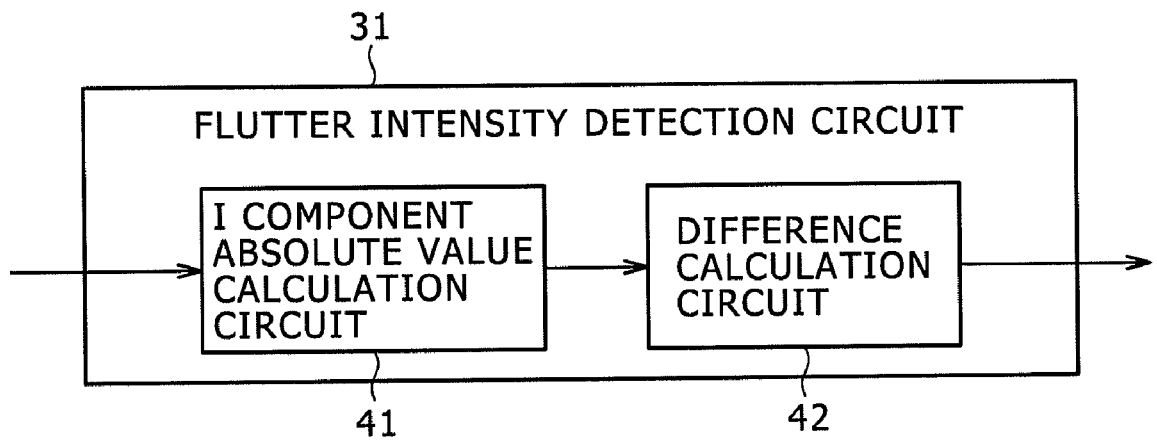
FIG. 4 is a block diagram illustrating a configuration example of the flutter intensity detection circuit shown in FIG. 3.

FIG. 4 is a block diagram illustrating a configuration example of the flutter intensity detection circuit 31 shown in FIG. 3.

When the carrier is modulated using VSB in which only the real number component contains information, the flutter intensity detection circuit 31 includes an I component absolute value calculation circuit 41 and difference calculation circuit 42 as illustrated in FIG. 4.

The I component absolute value calculation circuit 41 calculates the absolute value of the amplitude of the I component in the equalized signal. The same circuit 41 outputs the signal representing the calculated absolute value to the difference calculation circuit 42.

The difference calculation circuit 42 calculates the difference between the amplitude of the I component serving as the target and the absolute value of the amplitude of the I component calculated by the I component absolute value calculation circuit 41. The same circuit 42 outputs the signal representing the calculated difference to the gain circuit 32 as the signal representing the intensity of the flutter component in the equalized signal.

Figure 5:
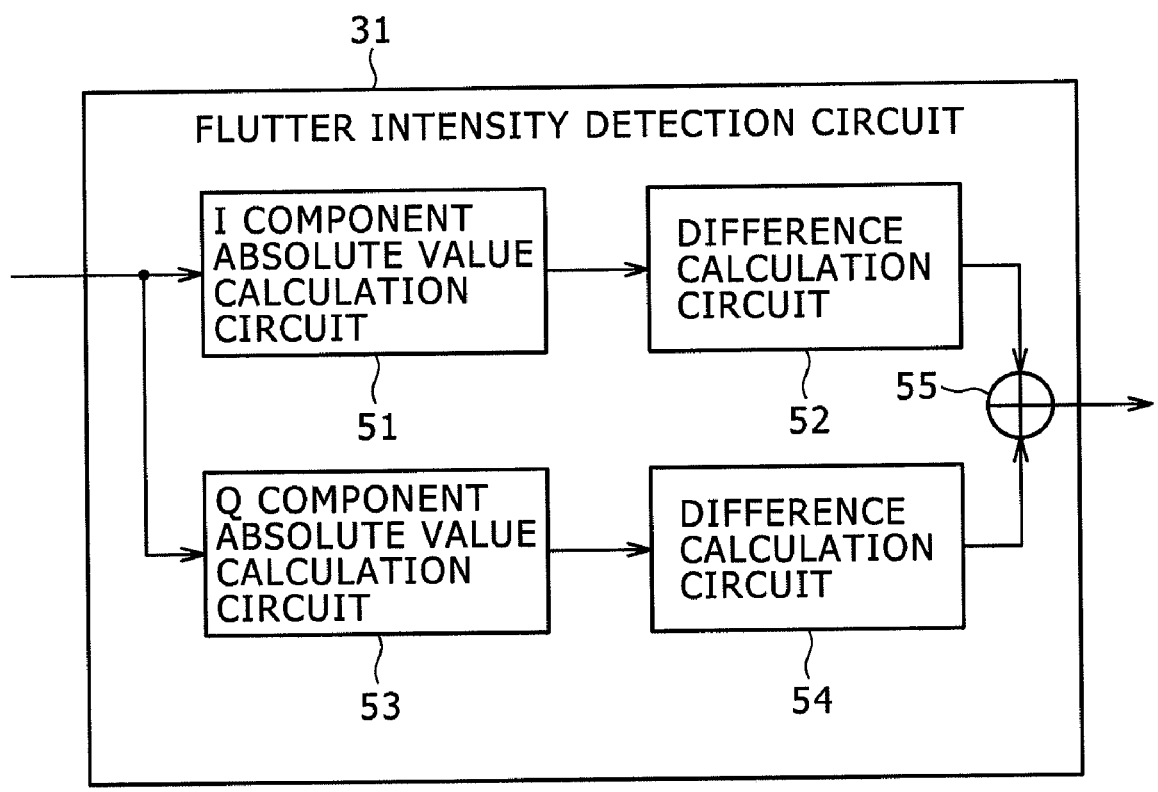
FIG. 5 is a block diagram illustrating another configuration example of the flutter intensity detection circuit shown in FIG. 3.

FIG. 5 is a block diagram illustrating another configuration example of the flutter intensity detection circuit 31.

When the carrier is modulated using QAM in which both the real and imaginary number components contain information, the flutter intensity detection circuit 31 includes an I component absolute value calculation circuit 51, a difference calculation circuit 52, Q component absolute value calculation circuit 53, difference calculation circuit 54 and an adder 55. The equalized signal from the equalization circuit 3 is fed to the I component absolute value calculation circuit 51 and Q component absolute value calculation circuit 53.

The I component absolute value calculation circuit 51 calculates the absolute value of the amplitude of the I component in the equalized signal. The same circuit 51 outputs the signal representing the calculated absolute value to the difference calculation circuit 52.

The difference calculation circuit 52 calculates the difference between the amplitude of the I component serving as the target and the absolute value of the amplitude of the I component calculated by the I component absolute value calculation circuit 51. The same circuit 52 outputs the signal representing the calculated difference to the adder 55.

The Q component absolute value calculation circuit 53 calculates the absolute value of the amplitude of the Q component in the equalized signal. The same circuit 53 outputs the signal representing the calculated absolute value to the difference calculation circuit 54.

The difference calculation circuit 54 calculates the difference between the amplitude of the Q component serving as the target and the absolute value of the amplitude of the Q component calculated by the Q component absolute value calculation circuit 53. The same circuit 54 outputs the signal representing the calculated difference to the adder 55.

The adder 55 adds the signal from the difference calculation circuit 52 and that from the difference calculation circuit 54 together. The adder 55 outputs the signal obtained from the addition to the gain circuit 32 as the signal representing the intensity of the flutter component in the equalized signal.

Figure 6:
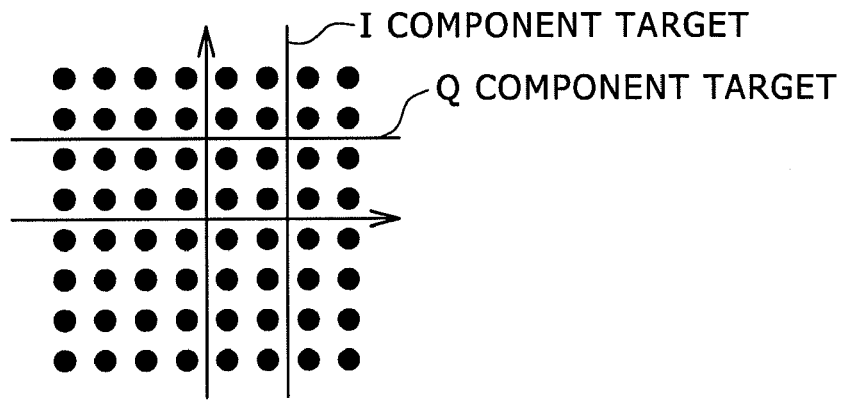
FIG. 6 is a diagram illustrating an example of target.

FIG. 6 is a diagram illustrating an example of target when 64 QAM is used as a modulation scheme.

As illustrated in FIG. 6, the averages of the absolute values of the amplitudes of the I and Q components, taking into consideration the ideal signal point arrangement, are calculated and set respectively in the difference calculation circuits 52 and 54 as the targets. If we focus our attention on an absolute value P of the amplitude of the equalized signal, the difference calculation circuit 52 calculates, for example, the difference corresponding to the horizontal distance between the absolute value P and I component target. On the other hand, the difference calculation circuit 54 calculates, for example, the difference corresponding to the vertical distance between the absolute value P and Q component target.

It should be noted that the power level (square of the amplitude of the I component or sum of the squares of the amplitudes of the I and Q components) may be used by the flutter intensity detection circuit 31 rather than the absolute values of the amplitudes to calculate the difference between the equalized signal and target.

Going back to the description of FIG. 3, the gain circuit 32 controls the amplitude of the signal from the flutter intensity detection circuit 31 according to the predetermined gain. The gain circuit 32 outputs the amplitude-controlled signal to the integration circuit 33.

The integration circuit 33 integrates the signal from the gain circuit 32 over a predetermined period and outputs the signal representing the integration result to the gain conversion circuit 34.

The gain conversion circuit 34 converts the integration result represented by the signal from the integration circuit 33 into a gain so that the flutter component intensity detected in the subloop can be used as the gain of the gain circuit 24 in the main loop. The same circuit 34 has information that represents the correspondence between the integration result and gain. The same circuit 34 outputs the signal representing the gain obtained from the conversion to the gain circuit 24.

As described above, the flutter correction circuit 11 adaptively controls the gain of the gain circuit 24 in the main loop according to the intensity of the flutter component in the equalized signal.

Figure 7:
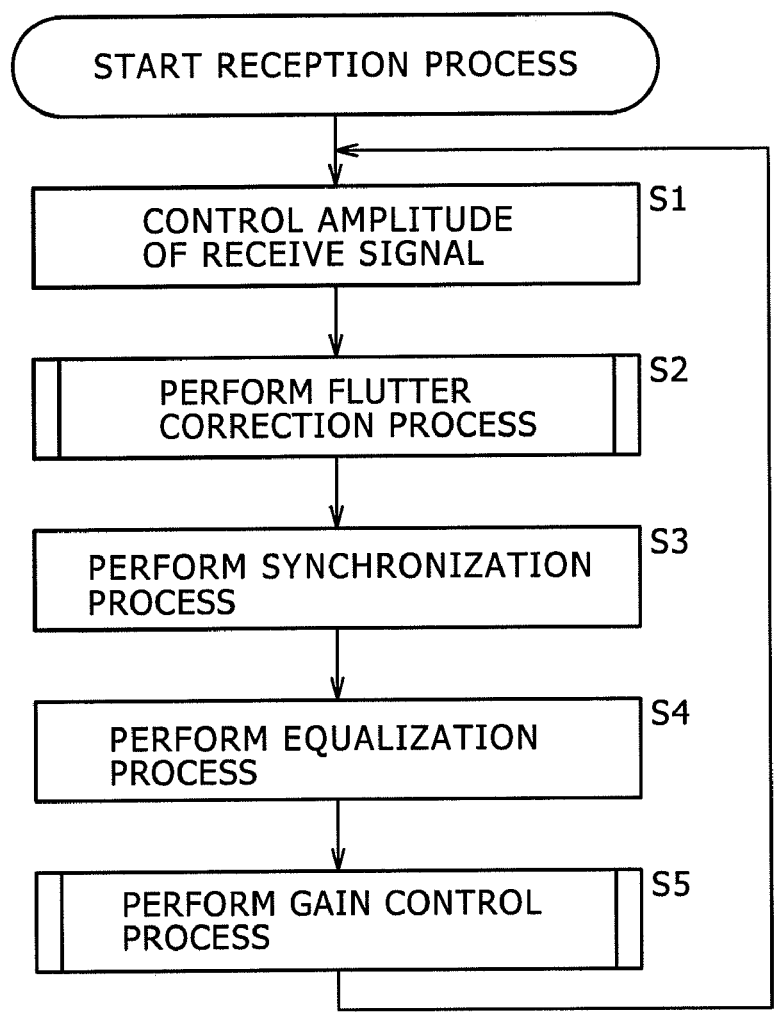
FIG. 7 is a flowchart describing the reception of the reception device.
Figure 8:
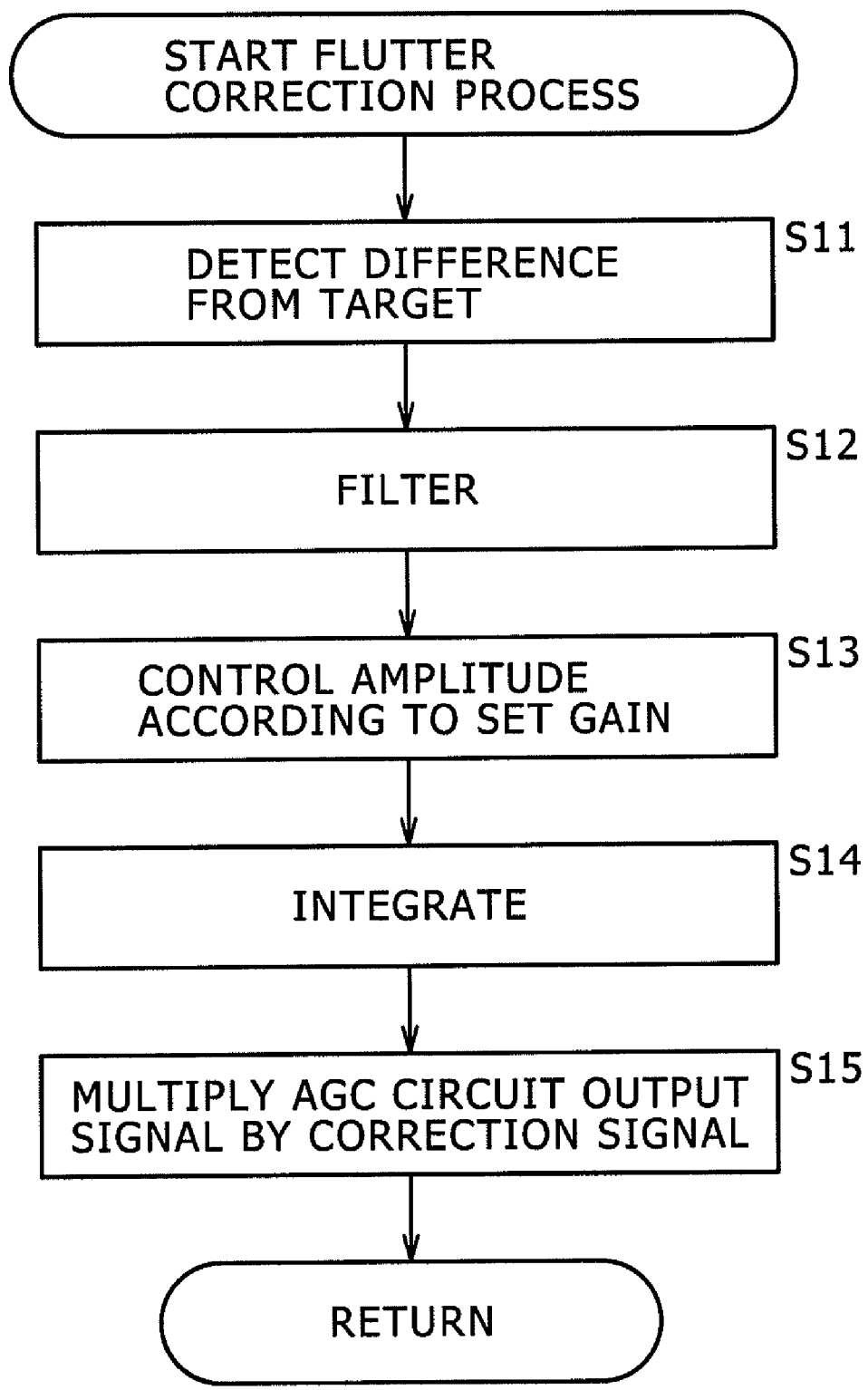
FIG. 8 is a flowchart describing the flatter correction performed in step S2 in FIG. 7.
Figure 9:
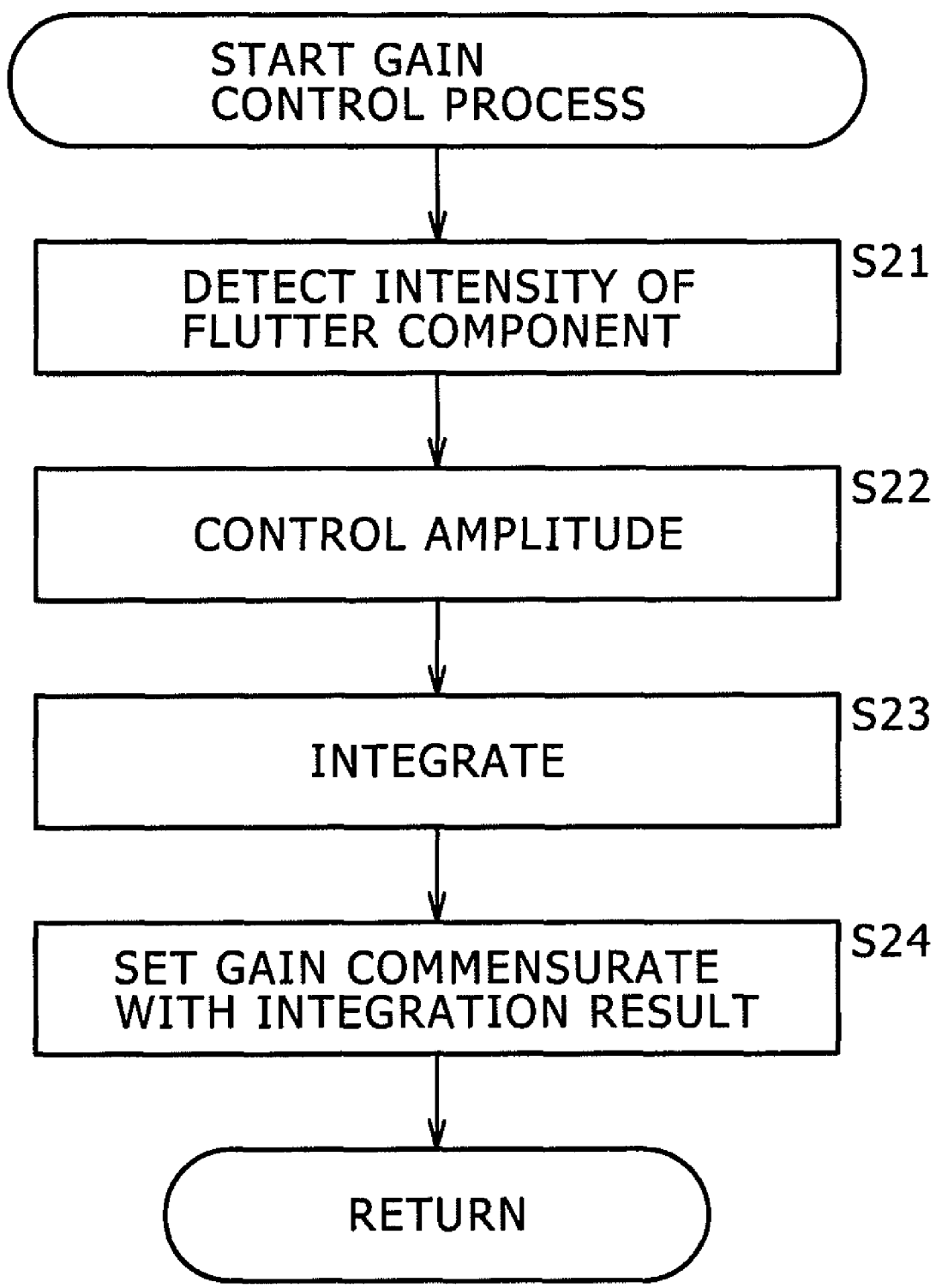
FIG. 9 is a flowchart describing the gain control performed in step S5 in FIG. 7.

Here, a description will be given of the processes performed by the demodulating section of the reception device configured as described above with reference to the flowcharts shown in FIGS. 7 to 9. The process in each of the steps in FIGS. 7 to 9 is performed, as appropriate, in parallel with, or before, or after a process in other step.

A description will be given first of the reception process of the reception device with reference to the flowchart shown in FIG. 7.

In step S1, the AGC circuit 1 controls the amplitude of the receive signal from the antenna according to a predetermined gain. The same circuit 1 outputs the amplitude-controlled signal to the flutter correction circuit 11.

In step S2, the flutter correction circuit 11 performs a flutter correction process and outputs the signal whose flutter component has been corrected to the synchronization circuit 2. The flutter correction process will be described later with reference to the flowchart shown in FIG. 8.

In step S3, the synchronization circuit 2 performs a synchronization process and outputs the signal obtained from the synchronization process to the equalization circuit 3.

In step S4, the equalization circuit 3 performs an equalization process on the signal from the synchronization circuit 2 and outputs the equalized signal obtained from the equalization process. The equalized signal from the equalization circuit 3 is also supplied to the flutter correction circuit 11.

In step S5, the flutter correction circuit 11 performs a gain control process adapted to control the gain of the main loop based on the equalized signal from the equalization circuit 3. The gain control process will be described later with reference to the flowchart shown in FIG. 9.

The above processes will be repeated during the reception of a broadcast wave by the reception device.

A description will be given next of the flutter correction process performed in step S2 of the flowchart shown in FIG. 7 with reference to the flowchart shown in FIG. 8.

In step S11, the difference detection circuit 22 detects the difference between the signal whose flutter component has been corrected from the multiplication circuit 21 and the target signal. The same circuit 22 outputs the signal representing the detected difference to the IIR filter 23.

In step S12, the IIR filter 23 filters the signal from the difference detection circuit 22 and outputs the signal obtained from the filtering to the gain circuit 24.

In step S13, the gain circuit 24 controls the amplitude of the signal from the IIR filter 23 according to the gain represented by the signal from the gain conversion circuit 34 of the signal processing circuit 26. The same circuit 24 outputs the amplitude-controlled signal to the integration circuit 25.

In step S14, the integration circuit 25 integrates the signal from the gain circuit 24 over a predetermined period and outputs the signal obtained from the integration to the multiplication circuit 21 as a correction signal.

In step S15, the multiplication circuit 21 multiplies the signal from the AGC circuit 1 by the correction signal from the integration circuit 25 to correct the flutter component in the signal from the AGC circuit 1. The signal obtained from the correction of the flutter component is supplied to the synchronization circuit 2 and difference detection circuit 22. Then, the control returns to step S2 in FIG. 7 to continue with the subsequent processes.

A description will be given next of the gain control process performed in step S5 of the flowchart shown in FIG. 7 with reference to the flowchart shown in FIG. 9.

In step S21, the flutter intensity detection circuit 31 of the signal processing circuit 26 detects the difference between the equalized signal and the flutter component intensity detection target as the intensity of the flutter component in the equalized signal. The same circuit 31 outputs the signal representing the detected intensity to the gain circuit 32.

In step S22, the gain circuit 32 controls the amplitude of the signal from the flutter intensity detection circuit 31 according to the predetermined gain and outputs the amplitude-controlled signal to the integration circuit 33.

In step S23, the integration circuit 33 integrates the signal from the gain circuit 32 over a predetermined period and outputs the signal representing the integration result to the gain conversion circuit 34.

In step S24, the gain conversion circuit 34 converts the integration result represented by the signal from the integration circuit 33 into a gain and sets the gain in the gain circuit 24. Then, the control returns to step S5 in FIG. 7 to continue with the subsequent processes.

The above processes allow for the reception device to adaptively control the gain of the gain circuit 24 in the main loop of the flutter correction circuit 11 according to the change in the intensity of the flutter component in the equalized signal.

Further, the above processes allow for the reception device to respond to the occurrence of a flutter to maintain synchronization while at the same time preventing a retry of the processes of the demodulation section as a whole. Further, the above processes eliminate the need for the switching adapted to increase the gain of the AGC circuit 1, thus providing reduced time for the demodulation section to lock.

In the description given above, the flutter component intensity is detected based on the equalized signal and target. However, the flutter component intensity may be detected using the signal whose flutter component has been corrected from the multiplication circuit 21.

Figure 10:
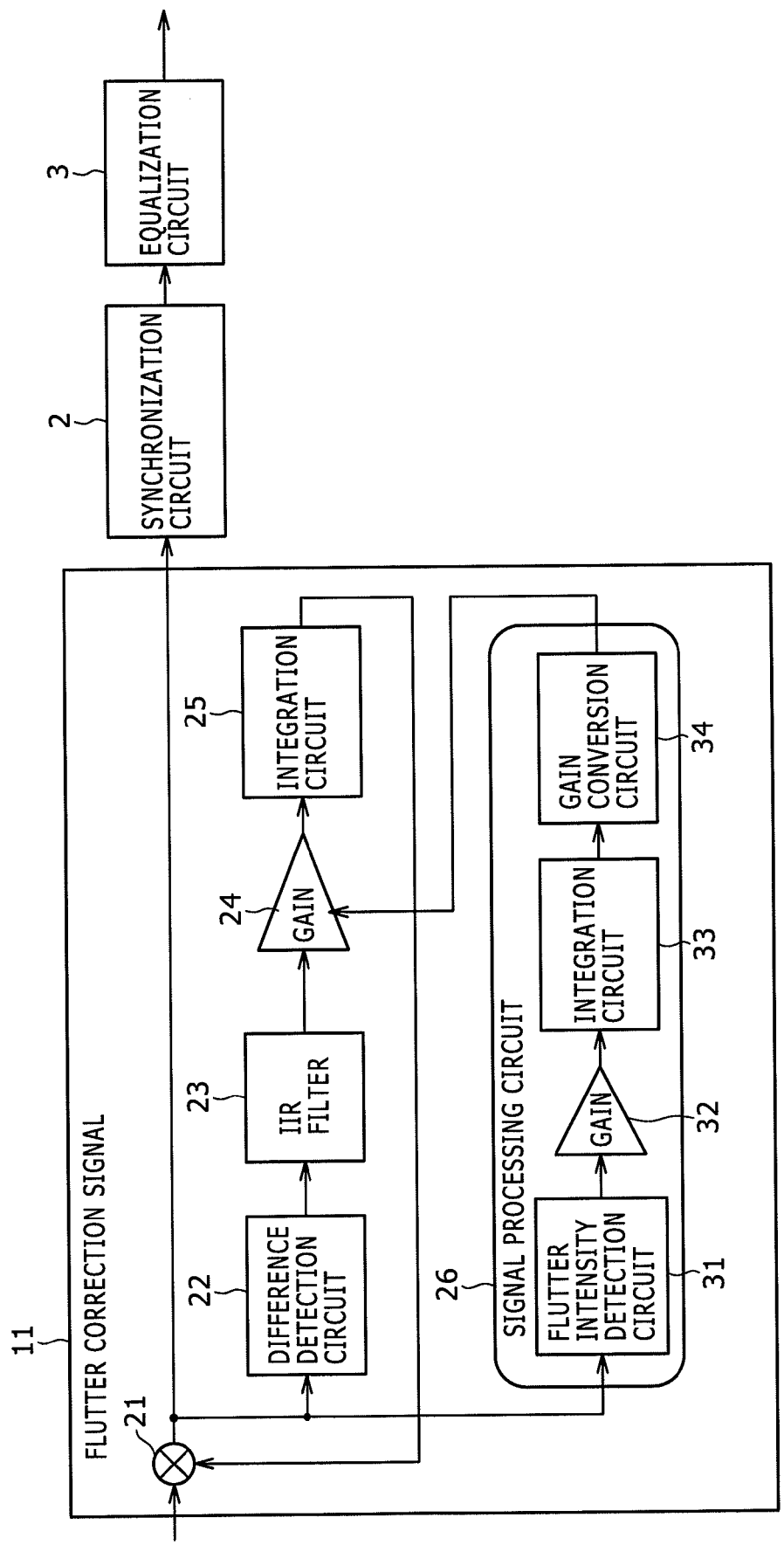
FIG. 10 is a block diagram illustrating another configuration example of the demodulating section.

FIG. 10 is a block diagram illustrating a configuration example of the flutter correction circuit 11 adapted to detect the flutter component intensity using the signal whose flutter component has been corrected. A duplicate description will be omitted as appropriate.

In this case, the signal whose flutter component has been corrected from the multiplication circuit 21 is fed to the flutter intensity detection circuit 31 rather than the equalized signal from the equalization circuit 3 as illustrated in FIG. 10. The flutter intensity detection circuit 31 detects the flutter component intensity based on the signal whose flutter component has been corrected and the target. The same circuit 31 outputs the signal representing the detected intensity to the gain circuit 32.

The output signal of the difference detection circuit 22 may be fed to the gain circuit 32 to control the gain of the gain circuit 24.

In the above description, the gain of the gain circuit 24 is controlled according to the flutter component intensity. However, the order of the IIR filter 23 may also be adaptively controlled.

Figure 11:
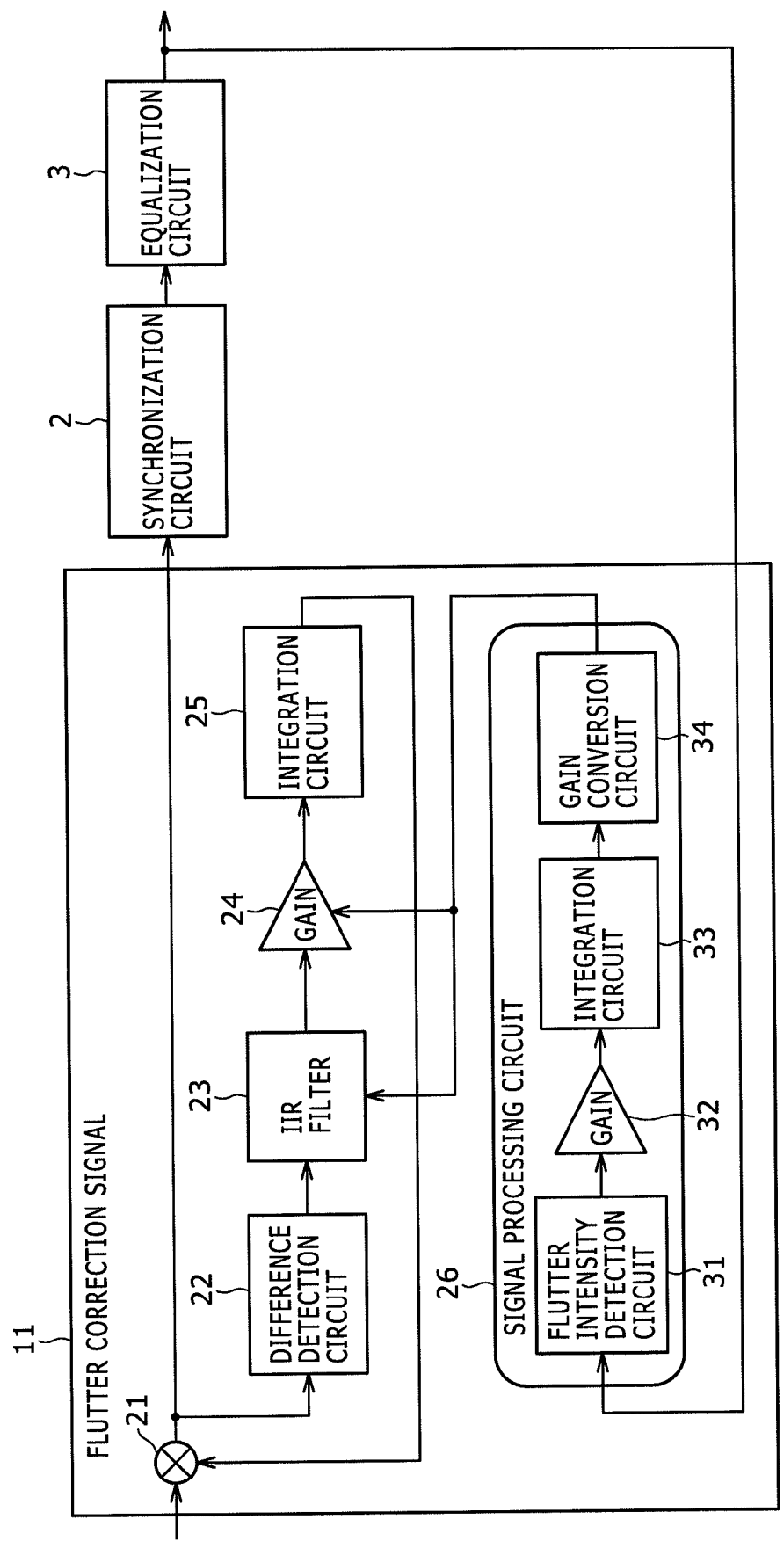
FIG. 11 is a block diagram illustrating still another configuration example of the demodulating section.

FIG. 11 is a block diagram illustrating a configuration example of the flutter correction circuit 11 adapted to control the gain of the gain circuit 24 and the order of the IIR filter 23 according to the flutter component intensity.

In this case, the signal from the gain conversion circuit 34 is supplied not only to the gain circuit 24 but also to the IIR filter 23. The gain of the gain circuit 24 and the order of the IIR filter 23 are controlled according to the signal from the gain conversion circuit 34. For example, if the intensity of the flutter component is high, the order of the IIR filter 23 is large. If the intensity of the flutter component is low, the order of the IIR filter 23 is small.

In the configuration shown in FIG. 11, the flutter component intensity may be detected using the signal whose flutter component has been corrected from the multiplication circuit 21 rather than the equalized signal.

The above series of processes may be performed by hardware or software. If the series of processes are performed by software, the program making up the software is installed from a program recording medium to a computer incorporated in dedicated hardware, or to a general-purpose computer capable of performing various intended functions when installed with various programs, or other computers.

FIG. 12 is a block diagram illustrating a configuration example of a computer adapted to perform the above series of processes using a program.

A CPU (Central Processing Unit) 61, ROM (Read Only Memory) 62 and RAM (Random Access Memory) 63 are connected with each other by a bus 64.

An I/O interface 65 is further connected to the bus 64. An input section 66, output section 67, storage section 68, communication section 69 and drive 70 are connected to the I/O interface 65. The input section 66 includes a keyboard, mouse, microphone and other input devices. The output section 67 includes a display, speaker and other output devices. The storage section 68 includes a harddisk, nonvolatile memory and other storage devices. The communication section 69 includes network interface and other components. The drive 70 drives a removable medium 71 such as an optical disk, semiconductor memory or other storage medium.

In the computer configured as described above, for example, the above processes are performed as the CPU 61 loads the program from the storage section 68 into the RAM 63 via the I/O interface 65 and bus 64 for execution.

For example, the program executed by the CPU 61 is supplied in the removable medium 71 in which the program is recorded. Alternatively, the program is supplied via a wired or wireless transmission medium such as a local area network, the Internet or digital broadcasting. The supplied program is installed to the storage section 68.

It should be noted that the program executed by the computer may be designed to perform the processes chronologically according to the sequence described in the present specification. Alternatively, the program may be designed to perform the processes when necessary as when the program is invoked.

It should be understood by those skilled in the art that various modifications, combinations, sub-combinations and alterations may occur depending on design requirements and other factors insofar as they are within the scope of the appended claims or the equivalents thereof.

What is claimed is:

1. A reception device comprising:
    an automatic gain control circuit adapted to control the amplitude of a received signal;
    a correction circuit adapted to correct the flutter component in the output signal of the automatic gain control circuit;
    a synchronization circuit adapted to establish synchronization with the signal whose flutter component has been corrected by the correction circuit; and
    an equalization circuit adapted to perform an equalization process based on the signal with which synchronization has been established by the synchronization circuit and output the equalized signal, wherein
    the correction circuit includes
        a detection circuit adapted to detect the difference between the signal obtained by correcting the flutter component in the output signal of the automatic gain control circuit and the theoretical value signal whose flutter component has been corrected,
        an infinite impulse response filter adapted to filter the signal representing the difference detected by the detection circuit,
        a gain circuit adapted to control the amplitude of the output signal of the infinite impulse response filter according to a predetermined gain,
        a flutter component correction circuit adapted to multiply the output signal of the automatic gain control circuit by a correction signal commensurate with the output signal of the gain circuit to correct the flutter component in the output signal of the automatic gain control circuit, and
        a gain control circuit adapted to control the gain of the gain circuit based on the equalized signal from the equalization circuit or the signal obtained by correcting the flutter component in the output signal of the automatic gain control circuit.

2. The reception device of claim 1, wherein
    the gain control circuit sets the gain circuit to a gain commensurate with the intensity of the flutter component in the equalized signal from the equalization circuit.

3. The reception device of claim 2, wherein
    the gain control circuit finds the intensity of the flutter component using the absolute value of the real number component, the absolute value of the real and imaginary number components, the power level of the real number component or the power level of the real and imaginary number components in the equalized signal.

4. The reception device of claim 1, wherein
    the gain control circuit further controls the order of the infinite impulse response filter based on the equalized signal from the equalization circuit.

5. A reception method of a reception device, the reception device including:
    an automatic gain control circuit adapted to control the amplitude of a receive signal,
    a correction circuit adapted to correct the flutter component in the output signal of the automatic gain control circuit,
    a synchronization circuit adapted to establish synchronization with the signal whose flutter component has been corrected by the correction circuit, and
    an equalization circuit adapted to perform an equalization process based on the signal with which synchronization has been established by the synchronization circuit and output the equalized signal, the reception method comprising the steps of:
    detecting the difference between the signal obtained by correcting the flutter component in the output signal of the automatic gain control circuit and the theoretical value signal whose flutter component has been corrected;
    filtering the signal representing the detected difference;
    controlling the amplitude of the signal obtained by filtering according to a predetermined gain;
    multiplying the output signal of the automatic gain control circuit by a correction signal commensurate with the signal obtained by controlling the amplitude according to the predetermined gain to correct the flutter component in the output signal of the automatic gain control circuit; and
    controlling the predetermined gain based on the equalized signal or the signal obtained by correcting the flutter component in the output signal of the automatic gain control circuit.

6. A program embodied in a non-transitory computer-readable medium that when executed on a computer causes the processes of a reception device, the reception device the reception device including:
    an automatic gain control circuit adapted to control the amplitude of a receive signal, a correction circuit adapted to correct the flutter component in the output signal of the automatic gain control circuit,
a synchronization circuit adapted to establish synchronization with the signal whose flutter component has been corrected by the correction circuit, and
an equalization circuit adapted to perform an equalization process based on the signal with which synchronization has been established by the synchronization circuit and output the equalized signal, the program comprising the steps of:
detecting the difference between the signal obtained by correcting the flutter component in the output signal of the automatic gain control circuit and the theoretical value signal whose flutter component has been corrected;
filtering the signal representing the detected difference;
controlling the amplitude of the signal obtained by filtering according to a predetermined gain;
multiplying the output signal of the automatic gain control circuit by a correction signal commensurate with the signal obtained by controlling the amplitude according to the predetermined gain to correct the flutter component in the output signal of the automatic gain control circuit; and
controlling the predetermined gain based on the equalized signal from the equalization circuit or the signal obtained by correcting the flutter component in the output signal of the automatic gain control circuit.

* * * * *